United States Patent
Yamamoto et al.

(10) Patent No.: US 10,969,245 B2
(45) Date of Patent: Apr. 6, 2021

(54) MAGNETIC MARKER DETECTION METHOD AND MAGNETIC MARKER DETECTION DEVICE

(71) Applicant: AICHI STEEL CORPORATION, Tokai (JP)

(72) Inventors: Michiharu Yamamoto, Tokai (JP); Tomohiko Nagao, Tokai (JP); Hitoshi Aoyama, Tokai (JP)

(73) Assignee: AICHI STEEL CORPORATION, Tokai (JP)

(*) Notice: Subject to any disclaimer, the term of this patent is extended or adjusted under 35 U.S.C. 154(b) by 109 days.

(21) Appl. No.: 15/763,177

(22) PCT Filed: Oct. 17, 2016

(86) PCT No.: PCT/JP2016/080729
§ 371 (c)(1),
(2) Date: Mar. 26, 2018

(87) PCT Pub. No.: WO2017/069092
PCT Pub. Date: Apr. 27, 2017

(65) Prior Publication Data
US 2018/0283904 A1    Oct. 4, 2018

(30) Foreign Application Priority Data

Oct. 23, 2015    (JP) .............................. JP2015-208672

(51) Int. Cl.
*G01D 5/20* (2006.01)
*G05D 1/02* (2020.01)
(Continued)

(52) U.S. Cl.
CPC ......... *G01D 5/2006* (2013.01); *B62D 15/025* (2013.01); *B62D 15/029* (2013.01);
(Continued)

(58) Field of Classification Search
CPC ................. G01D 5/2006; G01D 5/145; G01D 2201/0213; G05D 1/0259; G05D 1/0261;
(Continued)

(56) References Cited

U.S. PATENT DOCUMENTS 4,401,181 A * 8/1983 Schwarz ............ B60K 31/0058
180/168
9,278,691 B1 * 3/2016 Zsombory ............. B60W 30/12
(Continued)

FOREIGN PATENT DOCUMENTS

CN    102937649 A    2/2013
JP    2-254394 A    10/1990
(Continued)

OTHER PUBLICATIONS

International Search Report dated Jan. 17, 2017 in PCT/JP2016/080729, 2 pages.
(Continued)

*Primary Examiner* — Huy Q Phan
*Assistant Examiner* — Dustin R Dickinson
(74) *Attorney, Agent, or Firm* — Oblon, McClelland, Maier & Neustadt, L.L.P.

(57) ABSTRACT

Provided is a magnetic marker detection method with high detection reliability. The magnetic marker detection method for detecting a magnetic marker (10) laid on a road while a vehicle (5) having a plurality of, at least two or more, magnetic sensors attached thereto is travelling includes a gradient generating process of generating a first magnetic gradient, which is a difference between magnetic measurement values of two magnetic sensors and a filter processing process of generating a filter output value by performing filter processing by a high-pass filter as to a change of the first magnetic gradient in a travelling direction of the (Continued)

vehicle. The magnetic marker (10) is detected by an arithmetic operation process regarding the filter output value.

17 Claims, 13 Drawing Sheets

(51) Int. Cl.
  *G01R 33/02* (2006.01)
  *B62D 15/02* (2006.01)
  *B60R 21/00* (2006.01)

(52) U.S. Cl.
  CPC ............... *G01R 33/02* (2013.01); *G05D 1/02* (2013.01); *G05D 1/0259* (2013.01); *B60R 21/00* (2013.01); *G05D 2201/0213* (2013.01)

(58) Field of Classification Search
  CPC .. G05D 1/0263; B62D 15/025; B62D 15/029; E01F 9/30
  See application file for complete search history.

(56) References Cited

U.S. PATENT DOCUMENTS

| | | | |
|---|---|---|---|
| 2003/0046021 | A1 | 3/2003 | Lasky et al. |
| 2005/0236210 | A1* | 10/2005 | Kawazoe ............... B60Q 9/008 180/272 |
| 2011/0264320 | A1 | 10/2011 | Arnaud et al. |
| 2013/0027028 | A1* | 1/2013 | Hohe ..................... G01D 5/145 324/207.11 |
| 2015/0150475 | A1* | 6/2015 | Varcoe ............... A61B 5/04005 600/409 |
| 2015/0247719 | A1* | 9/2015 | Huang ................. B62D 15/025 701/41 |

FOREIGN PATENT DOCUMENTS

| | | |
|---|---|---|
| JP | 8-201006 A | 8/1996 |
| JP | 9-244743 A | 9/1997 |
| JP | 2000-98009 A | 4/2000 |
| JP | 2000-227998 A | 8/2000 |
| JP | 2005-202478 A | 7/2005 |
| JP | 2013-217779 A | 10/2013 |
| KR | 20-0333857 Y1 | 11/2003 |

OTHER PUBLICATIONS

Extended European Search Report dated Jul. 26, 2019, in Patent Application No. 16857407.7, 10 pages.

\* cited by examiner

[FIG. 1]
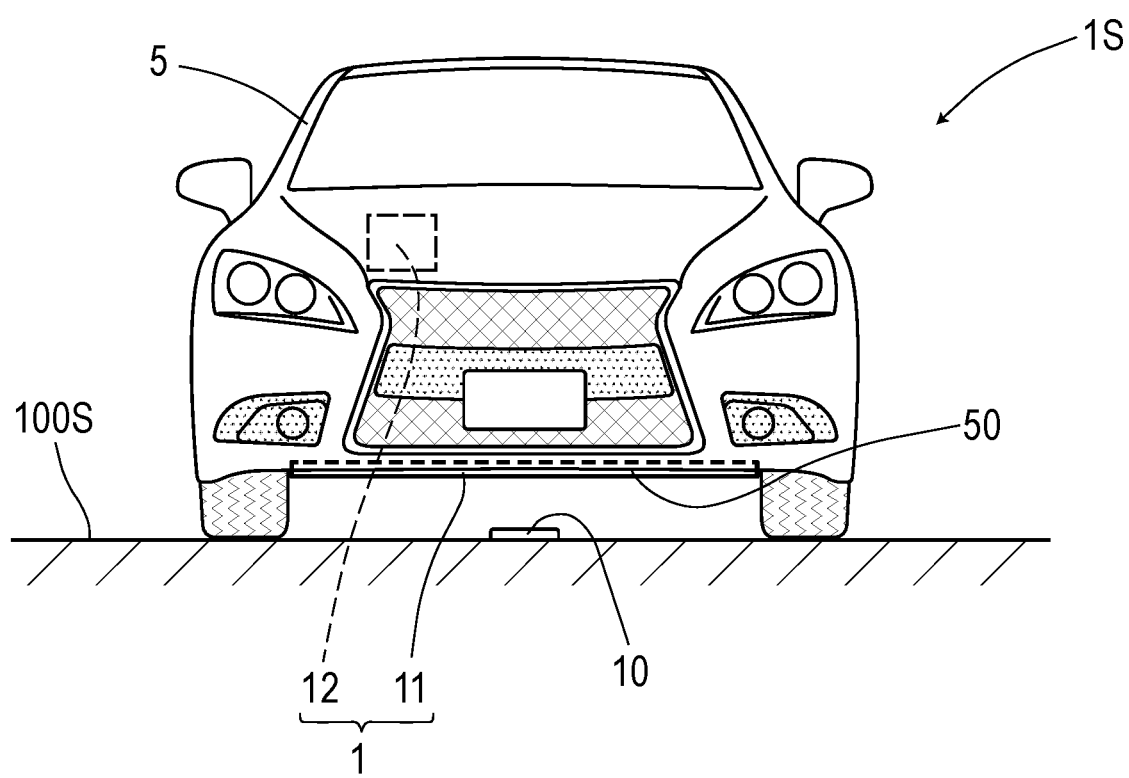

[FIG. 2]
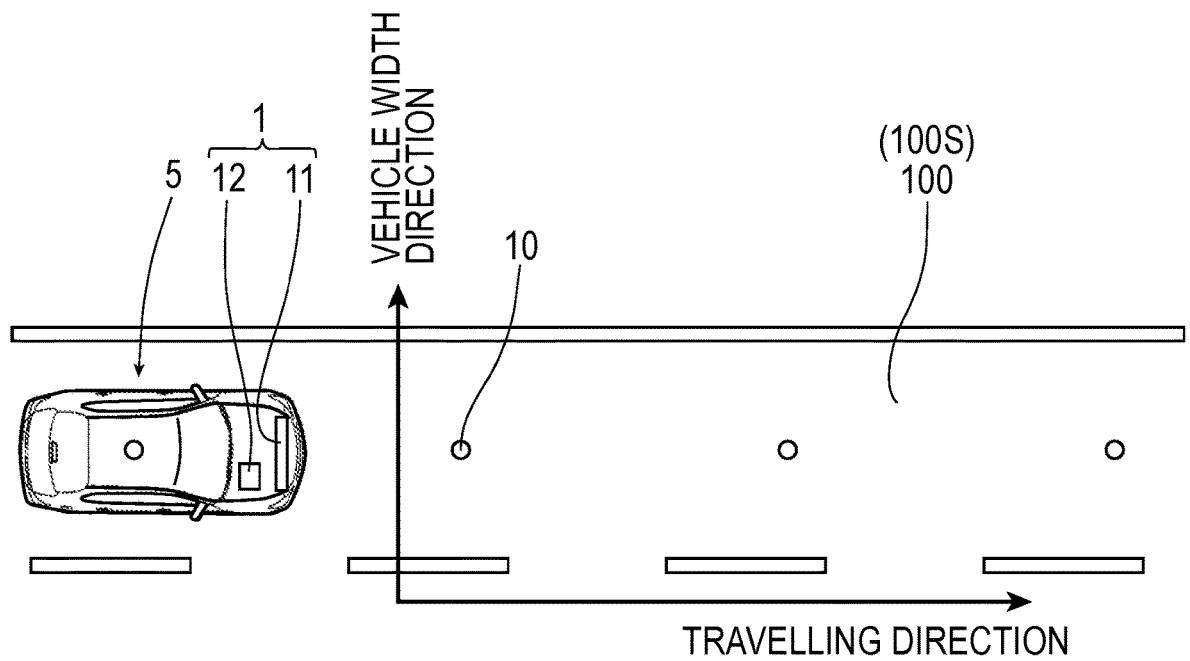

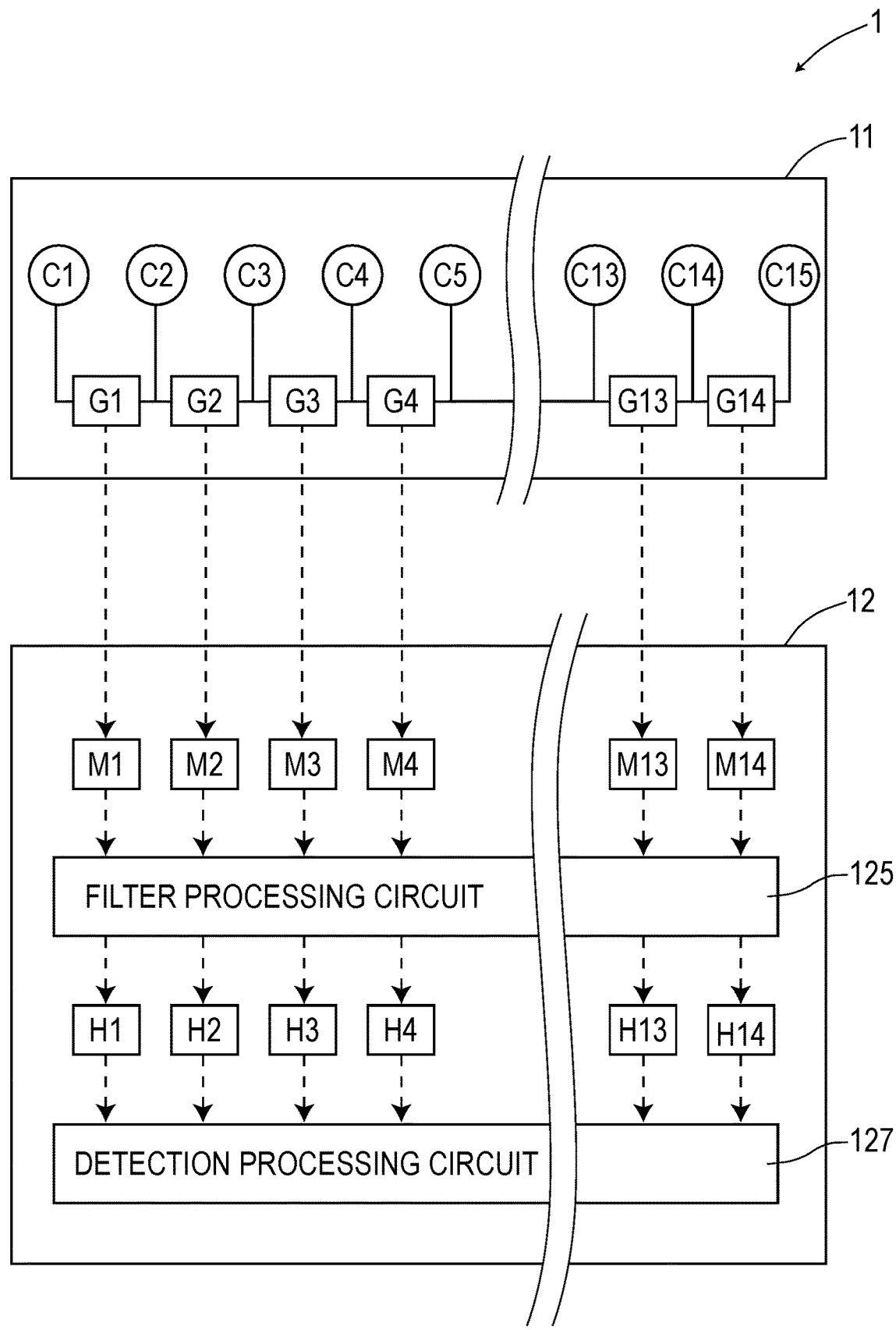
[FIG. 3]

[FIG. 4]
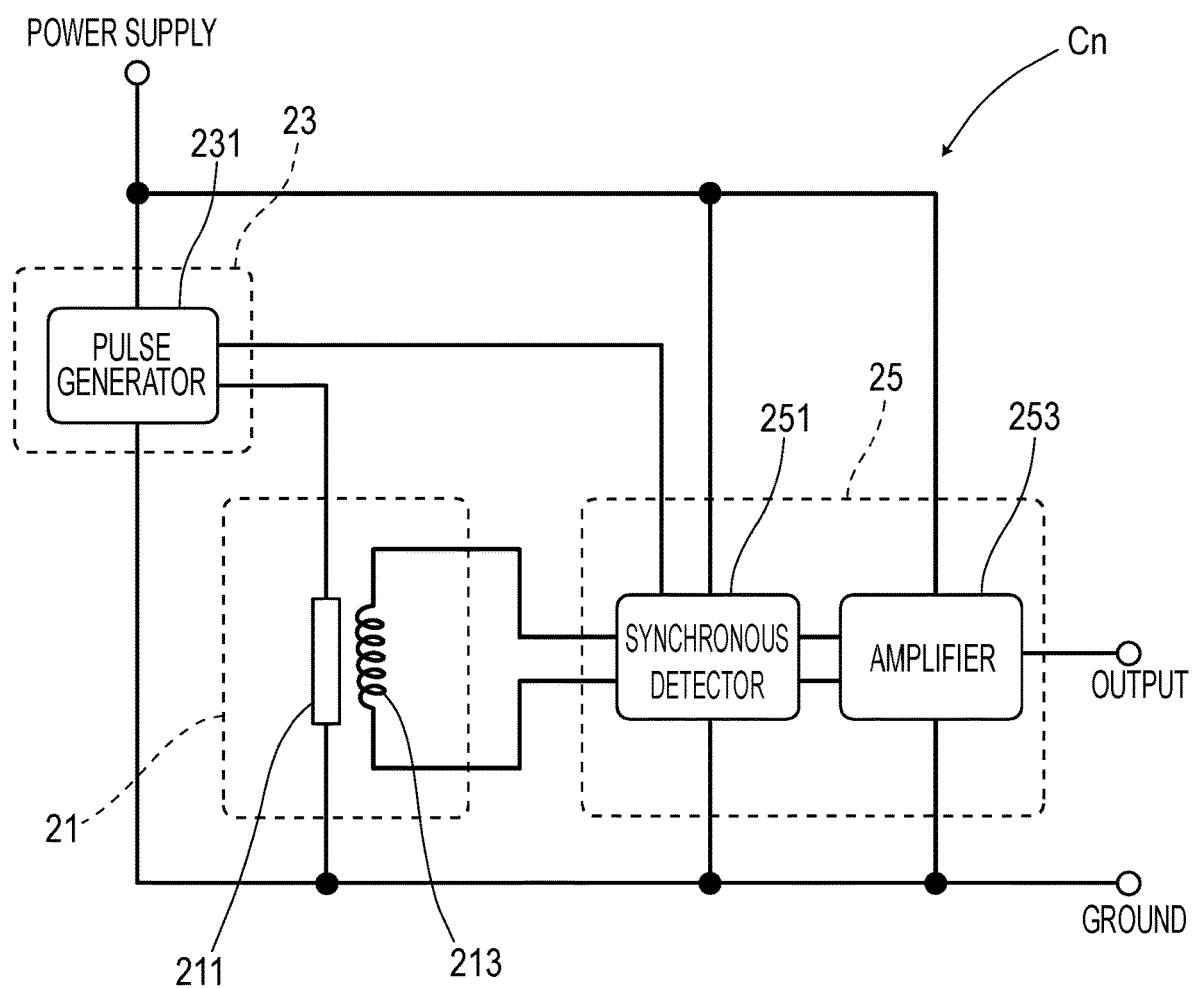

[FIG.5]
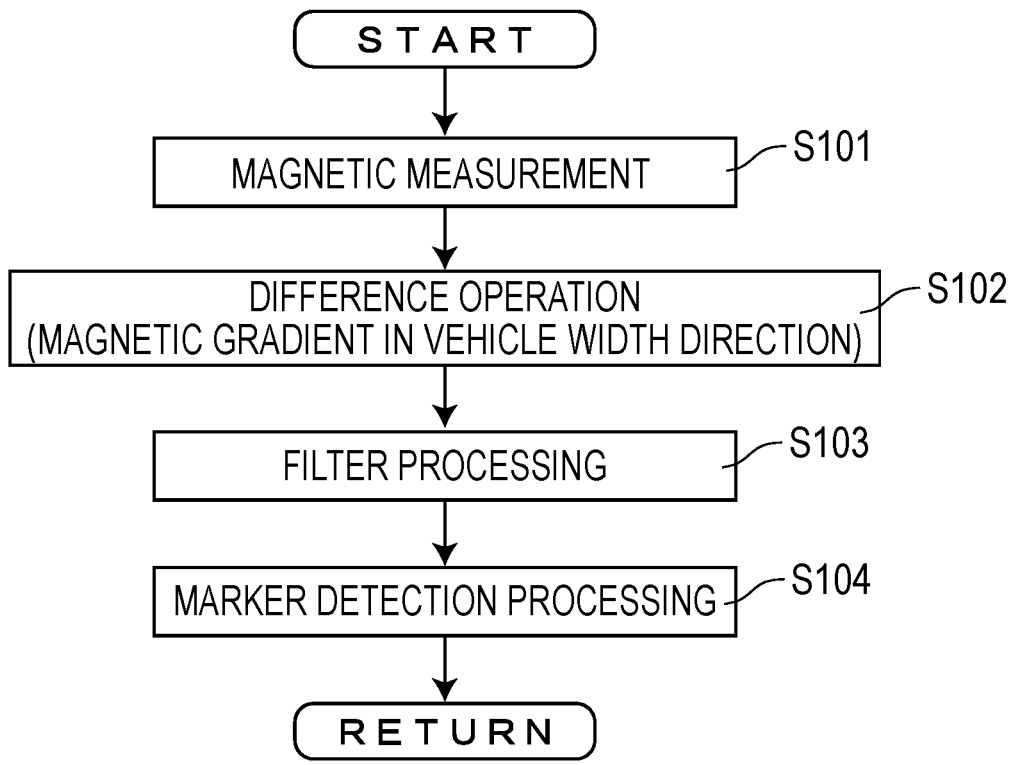

[FIG.6]
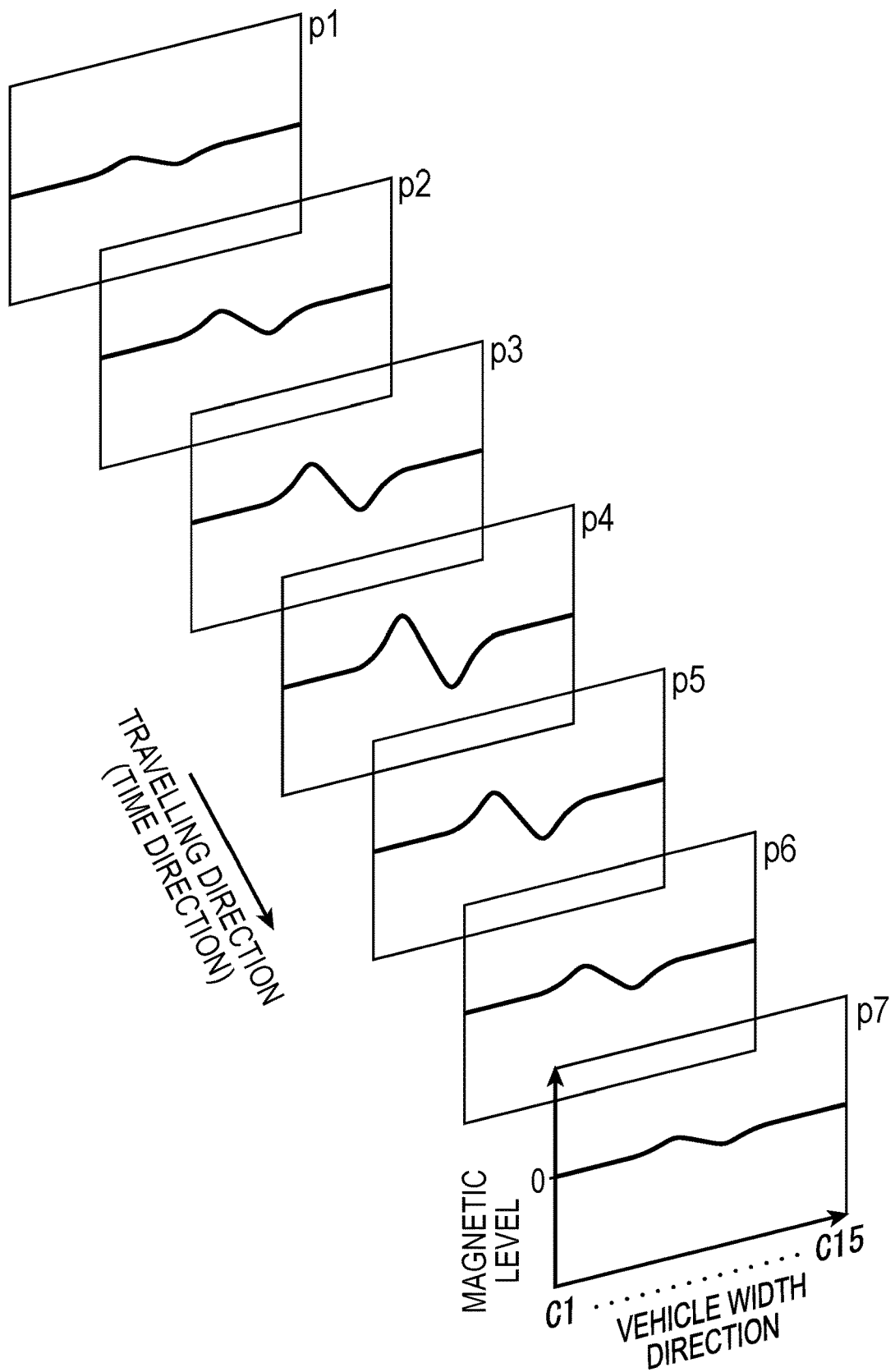

[FIG.7]
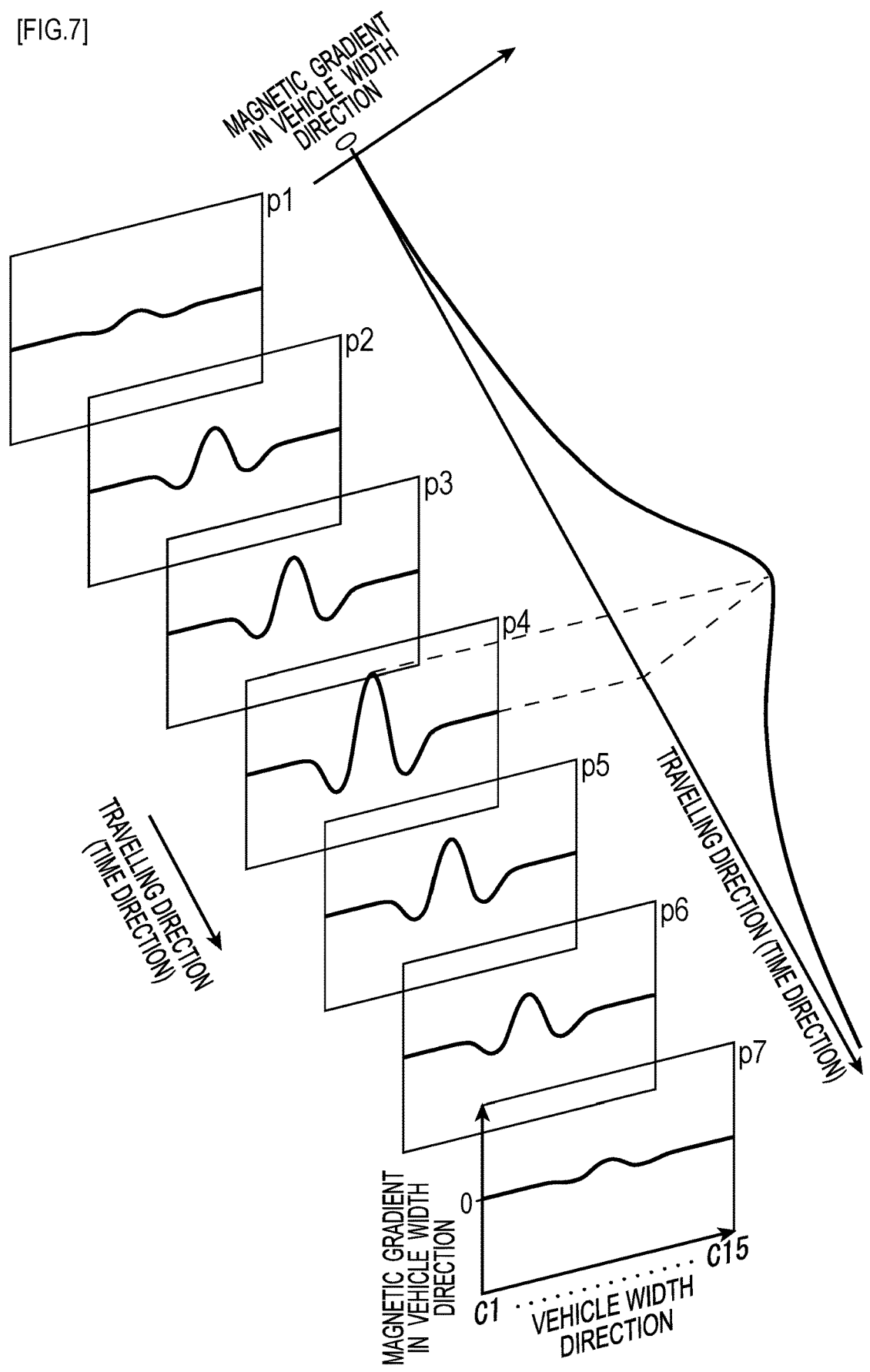

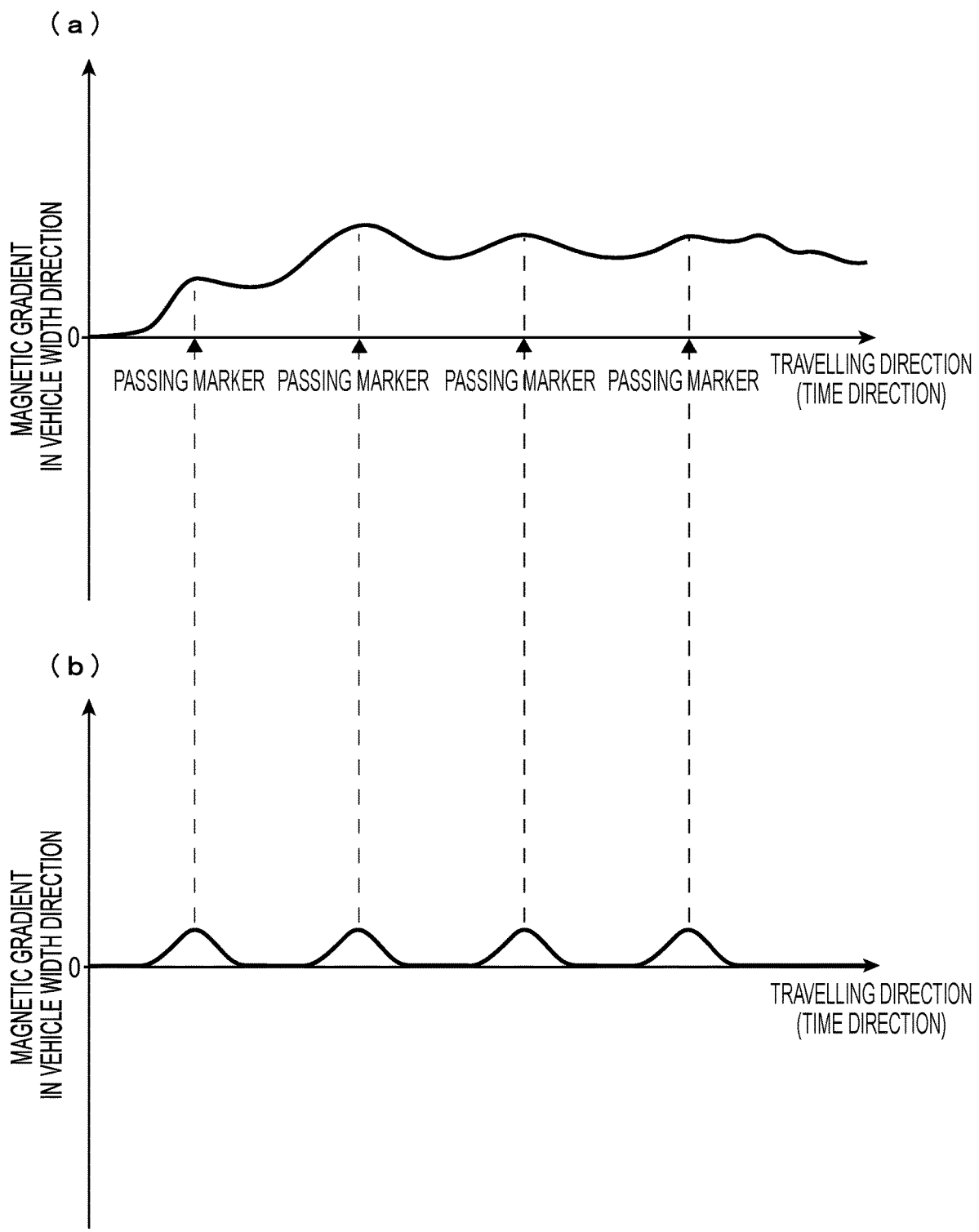

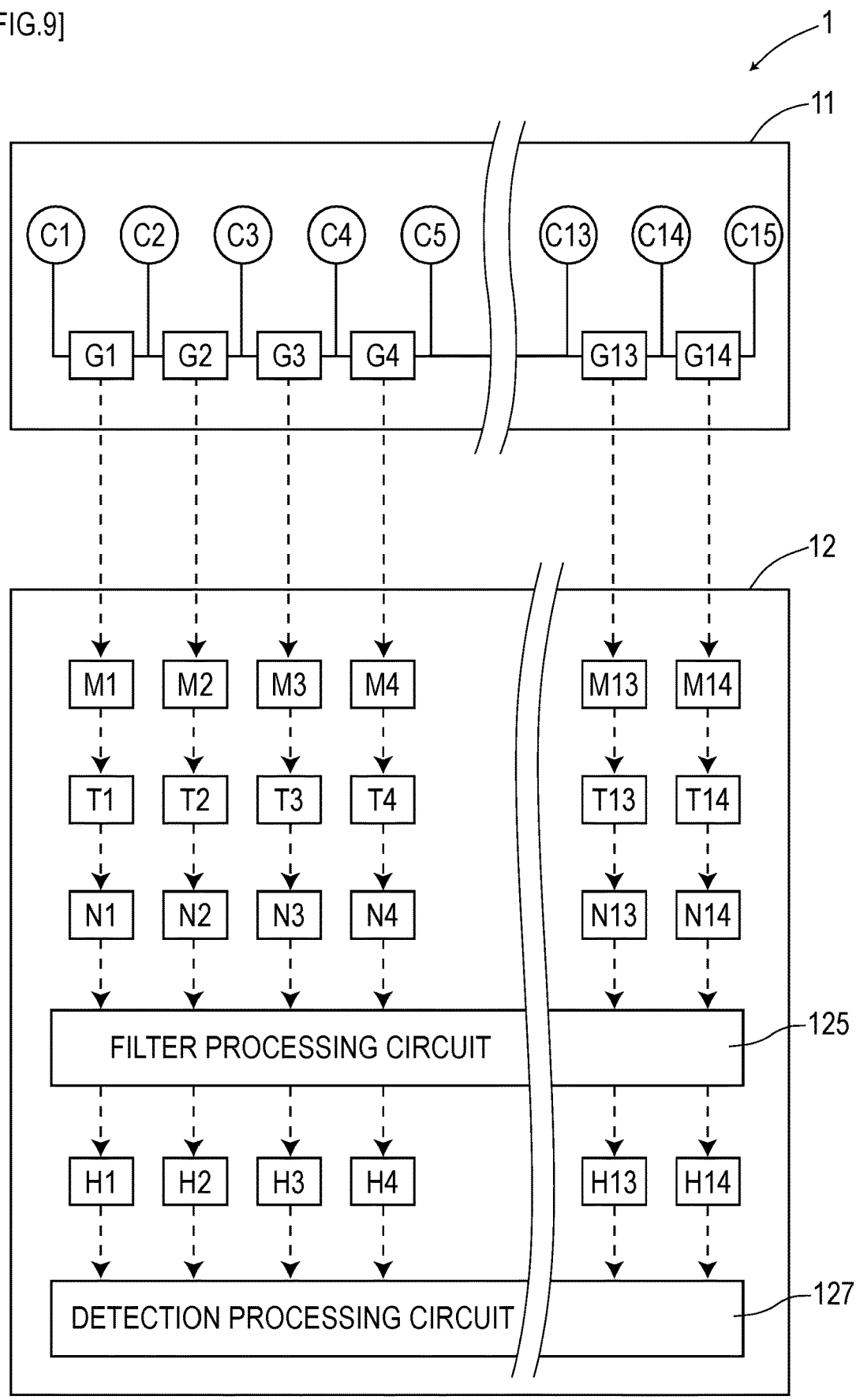
[FIG.9]

[FIG.10]
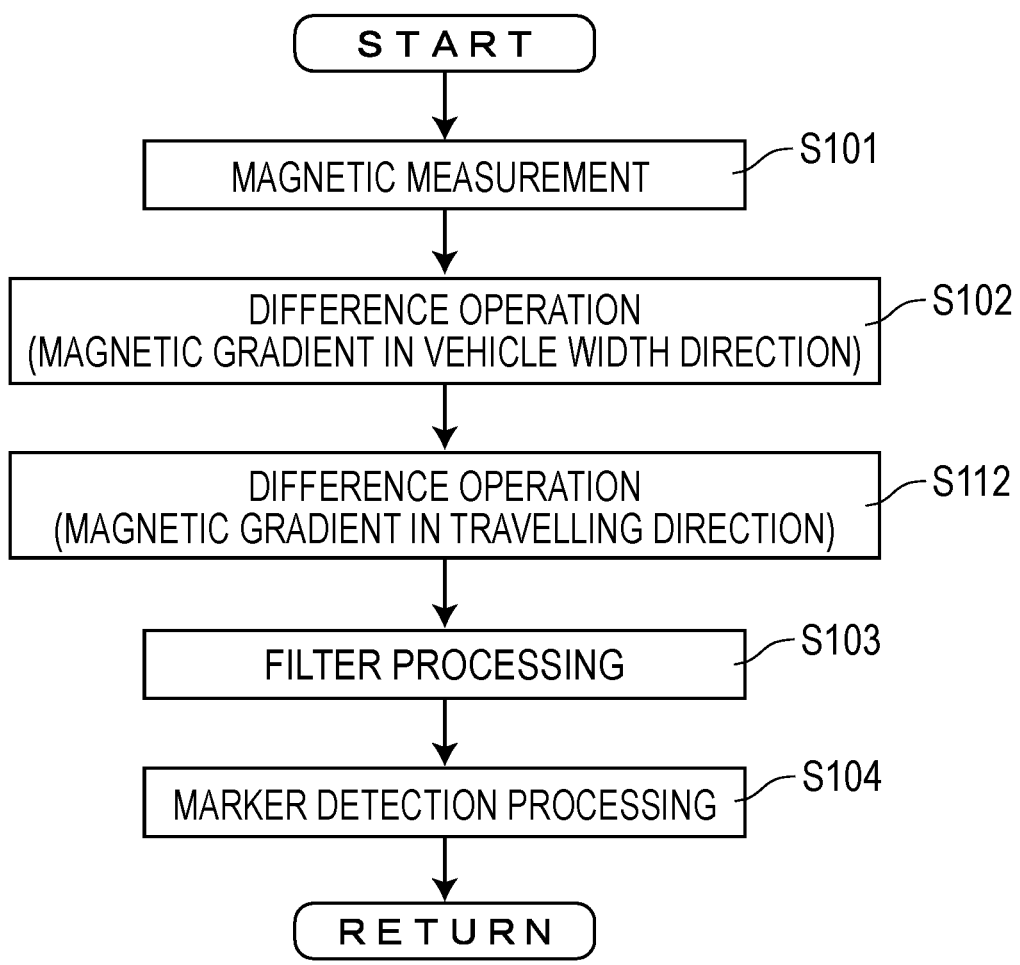

[FIG.11]
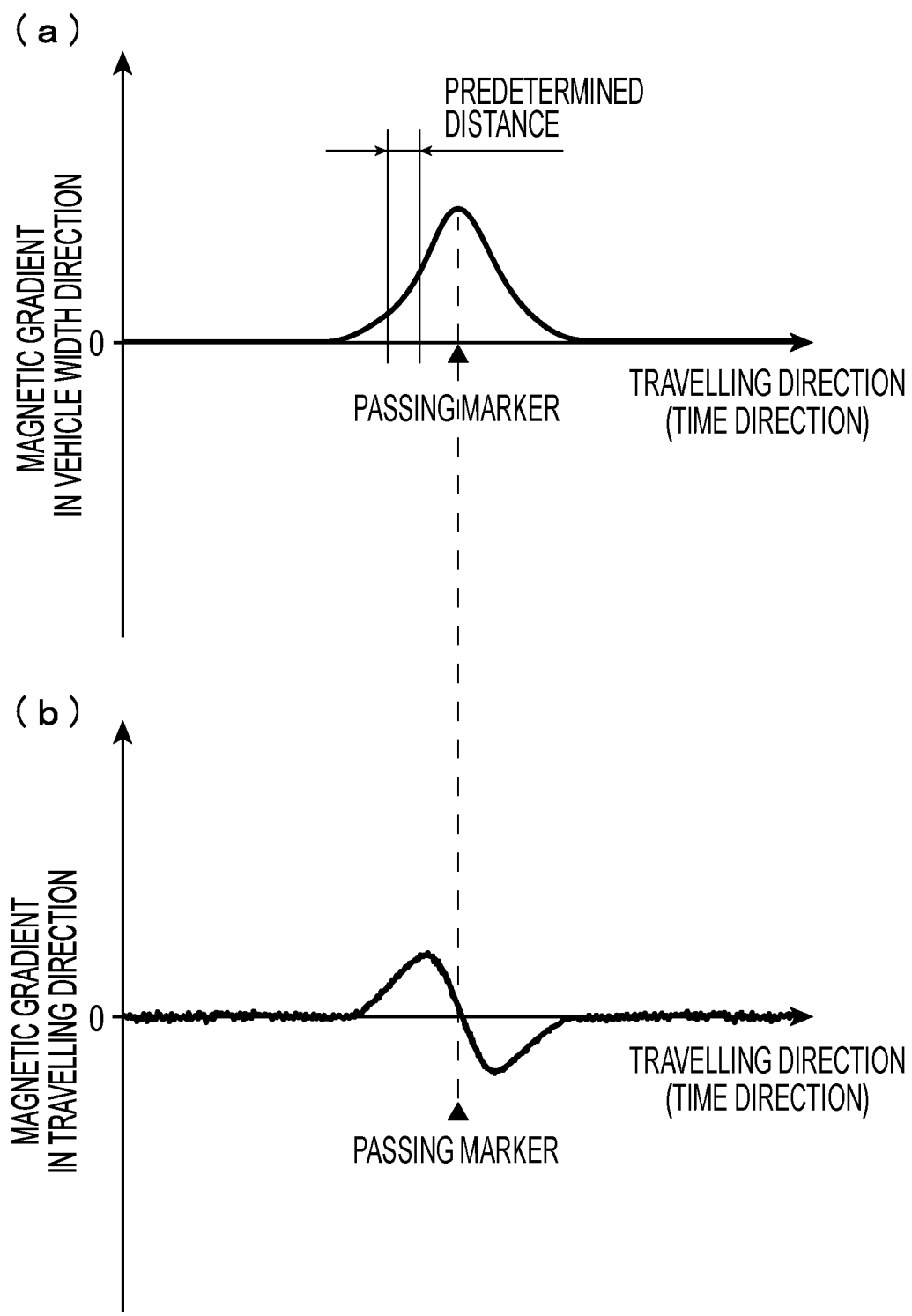

[FIG.12]
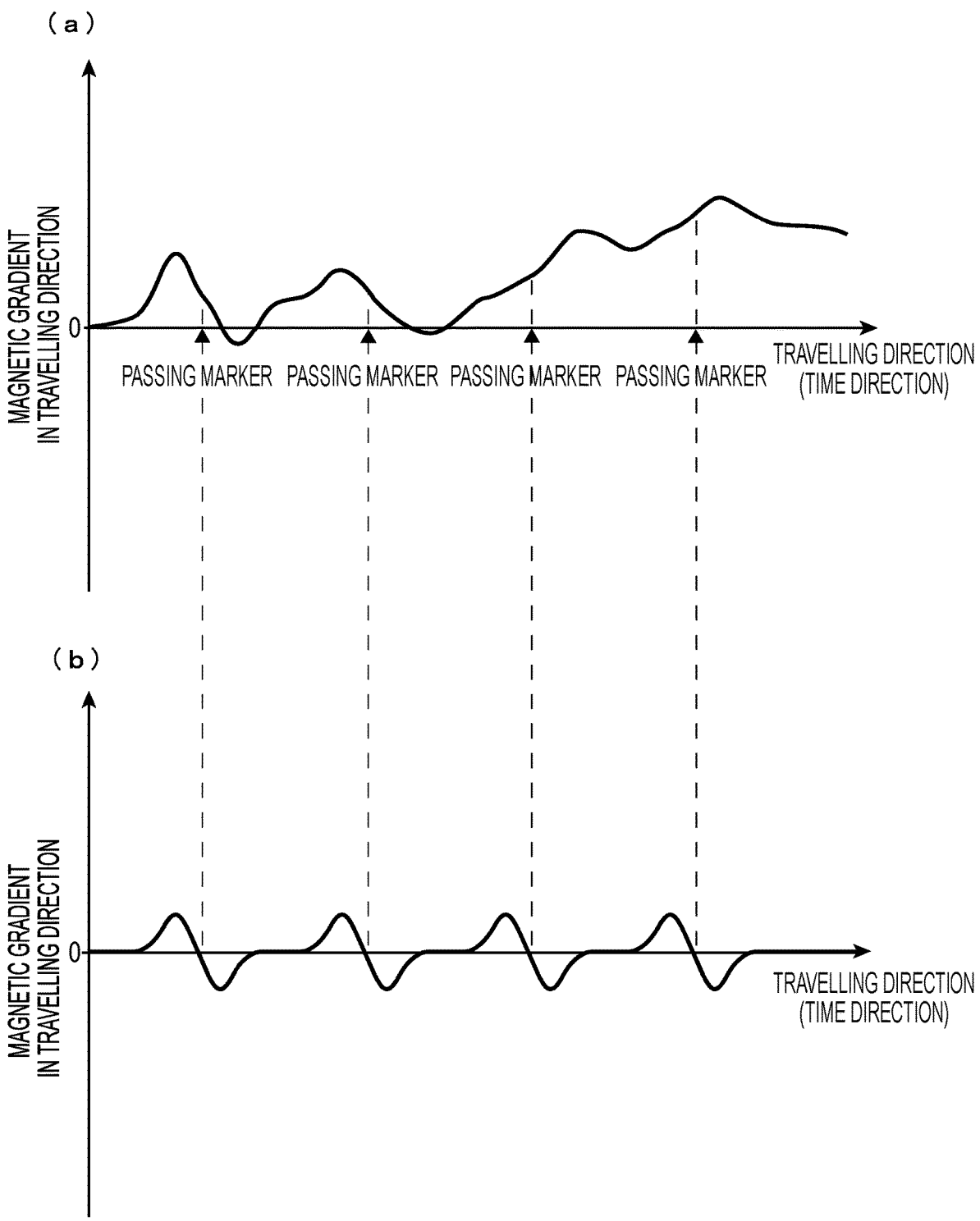

[FIG.13]
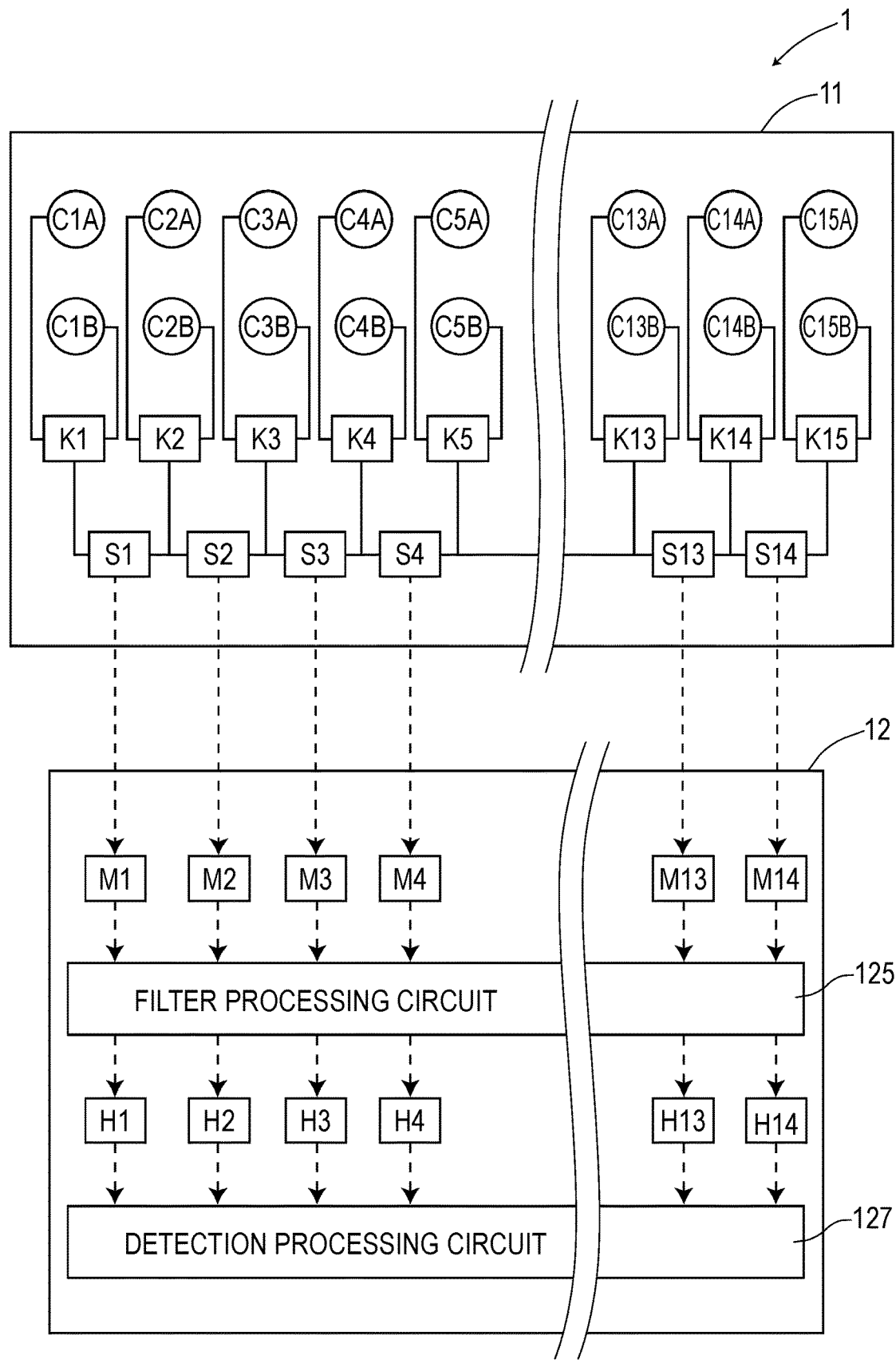

MAGNETIC MARKER DETECTION METHOD AND MAGNETIC MARKER DETECTION DEVICE

TECHNICAL FIELD OF THE INVENTION

The present invention relates to a method of detecting a magnetic marker laid on a road.

BACKGROUND OF THE INVENTION

Conventionally, a magnetic marker detection system for vehicles for using a magnetic marker laid on a road for vehicle control has been known (for example, refer to Japanese Unexamined Patent Application Publication No. 2005-202478). This magnetic marker detection system is achieved with a combination of a magnetic marker laid on a road and a magnetic marker detection device on a vehicle side including a magnetic sensor. For example, if the magnetic marker laid on the road along a lane can be detected by the vehicle side, various driving supports can be achieved, such as automatic steering control and lane departure warning.

PATENT LITERATURE

Patent Literature 1: JP 2005-202478

SUMMARY OF THE INVENTION

However, the above-described conventional magnetic marker detection system has the following problem. That is, due to disturbance magnetism acting on the magnetic sensor, reliability of detection of the magnetic marker may be impaired. For example, bridges, tunnels, and so forth in an RC structure forming a road have iron-made reinforcing plates, reinforcing iron bars, and so forth placed throughout the inside in order to ensure structural strength. Therefore, the structures such as bridges and tunnels may become large magnetism generation sources. While residual magnetization of iron materials such as reinforcing iron bars is subtle compared with magnets, magnetism more than geomagnetism may be generated due to the huge volume of bridges, tunnels, and so forth, and these structures may collect geomagnetism as is the case of yokes to generate a relatively large magnetic field. Magnetic fields from various magnetism generation sources present on the road such as, for example, bridges and tunnels, are one of the factors in degradation of reliability of detection of the magnet marker.

The present invention was made in view of the above-described conventional problem to provide a magnetic marker detection method and magnetic marker detection device with high detection reliability.

One aspect of the present invention is directed to a magnetic marker detection method for detecting a magnetic marker laid on a road by using a plurality of, at least two or more, magnetic sensors attached to a vehicle, the method including:

a gradient generating process of generating a first magnetic gradient that can be calculated by first-order difference operation, second-order difference operation, or higher-order difference operation targeted on magnetic measurement values acquired in a same measurement period by two or more magnetic sensors among the plurality of magnetic sensors; and a filter processing process of generating a filter output value by performing filter processing for suppressing or cutting off at least a low frequency component as to a change of a magnetic gradient in a travelling direction of the vehicle, the magnetic gradient being at least either of a second magnetic gradient, which is a difference between said first magnetic gradients with the targeting magnetic measurement values acquired in different measurement periods, and the first magnetic gradient, and at least part of input data of processing for detecting the magnetic marker being the filter output value.

One aspect of the present invention is directed to a magnetic marker detection device mounted on a vehicle for detecting a magnetic marker laid on a road, the device including:

a plurality of, at least two or more, magnetic sensors; and a detection unit which detects the magnetic marker, the detection unit being configured to perform the above-described magnetic marker detection method.

The magnetic marker detection method according to the present invention was made by paying attention to the fact that a distribution of magnetic gradients occurring around a magnetism generation source is varied depending on the size of the magnetism generation source. In this magnetic marker detection method, by using the difference in distribution of the magnetic gradients as described, a magnetic component of a magnetism generation source larger in size than the magnetic marker is removed, thereby improving reliability of detection of the magnetic marker.

In the gradient generating process in the magnetic marker detection method according to the present invention, the first magnetic gradient is generated that can be calculated by difference operation targeted on magnetic measurement values acquired by the two or more magnetic sensors. According to this gradient generating process, magnetic noise uniformly acting on the two or more magnetic sensors can be removed, and only a magnetic gradient can be extracted.

In the filter processing process according to the present invention, the filter processing is performed as to a change of the magnetic gradient in the travelling direction. According to this filter processing, a low frequency component can be suppressed among changes of the magnetic gradient in the travelling direction. When magnetism generation sources of different sizes are assumed, the change of the magnetic gradient in a direction penetrating through a magnetic field is milder in the large-sized magnetism generation source, and is steeper in the small-sized magnetism generation source. According to the filter processing of suppressing a low frequency component as described above, a magnetic component derived from a magnetism generation source larger in size than the magnetic marker can be removed.

As described above, in the magnetic marker detection method according to the present invention, magnetism as disturbance is removed with a combination of the gradient generating process of removing uniformly-acting magnetic noise by using a difference between magnetic measurement values of the two or more magnetic sensors and the filter processing process of performing the filter processing as to a change of the magnetic gradient in the travelling direction.

The magnetic marker detection method according to the present invention has an excellent feature in that reliability of detection of the magnetic marker can be improved by suppressing magnetism acting from a magnetism generation source larger in size of the magnetic marker. The magnetic marker detection device which performs this magnetic marker detection method has an excellent feature of being able to reliably detect the magnetic marker.

BRIEF DESCRIPTIONS OF THE DRAWINGS

FIG. 1 is a front view depicting a vehicle having a sensor array attached thereto in a first embodiment;

FIG. 2 is a bird's-eye view of a lane where magnetic markers are laid in the first embodiment;

FIG. 3 is a block diagram for describing a functional structure of a magnetic marker detection device in the first embodiment;

FIG. 4 is a block diagram of the structure of a magnetic sensor in the first embodiment;

FIG. 5 is a flow diagram of a flow of a marker detection process in the first embodiment;

FIG. 6 is a diagram illustrating a change of a magnetic distribution in a vehicle width direction when the vehicle is passing through magnetic markers in the first embodiment;

FIG. 7 is a diagram for exemplarily describing a change of a magnetic gradient distribution in a vehicle width direction when a vehicle is passing through the magnetic markers in the first embodiment;

FIG. 8 is a diagram for describing filter processing in the first embodiment;

FIG. 9 is a block diagram for describing a functional structure of a magnetic marker detection device in a second embodiment, FIG. 10 is a flow diagram of a flow of a marker detection process in the second embodiment;

FIG. 11 is a graph depicting a temporal change of a magnetic gradient in the vehicle width direction and a magnetic gradient in a travelling direction in the second embodiment;

FIG. 12 is a diagram for describing filter processing in the second embodiment; and FIG. 13 is a block diagram for describing a functional structure of a magnetic marker detection device in a third embodiment.

DESCRIPTIONS OF THE PREFERRED EMBODIMENTS

As a combination of two or more magnetic sensors in the gradient generation process according to the present invention, a combination including two adjacent magnetic sensors may be adopted, or a combination including two magnetic sensors adjacent to each other via one or two other magnetic sensors may be adopted.

As for the first magnetic gradient that can be calculated by difference operation targeted on magnetic measurement values of the two or more magnetic sensors, calculating the first magnetic gradient actually by the difference operation is not an indispensable condition. The first magnetic gradient may have any value that can be calculated by difference operation. For example, even a first magnetic gradient acquired by finding a difference by using a difference circuit formed of an analog circuit is included in the concept of the present invention as long as this first magnetic gradient can also be calculated by difference operation.

The first magnetic gradient that can be calculated by first-order difference operation, second-order difference operation, or higher-order difference operation targeted on magnetic measurement values of two or more magnetic sensors include various differences. For example, for magnetic sensors arrayed vertically and horizontally in a two-dimensional array, the following are examples of the magnetic gradient that can be calculated by first-order difference operation, second-order difference operation, or higher-order difference operation targeted on magnetic measurement values of two or more magnetic sensors, and each correspond to the first magnetic gradient: a first difference, which is a difference between magnetic measurement values of two magnetic sensors in a vertical direction; a second difference, which is a difference between magnetic measurement values of two magnetic sensors in a lateral direction; a third difference, which is a difference between magnetic measurement values of two magnetic sensors in a diagonal direction; a fourth difference, which is a difference between first differences at two positions in the lateral direction; a fifth difference, which is a difference between the second differences at two positions in the vertical direction; and a sixth difference, which is a difference between the first differences at two positions in the vertical direction.

As for the magnetic measurement values acquired in a same measurement period by two or more magnetic sensors among the plurality of magnetic sensors, measurement periods are not required to be perfectly simultaneous. For example, when a measurement process is repeatedly performed, magnetic measurement values measured at the same lap in the repeated process can be adopted. For example, if it is difficult to completely simultaneously acquire the magnetic measurement values of the magnetic sensors and it is required to sequentially acquire the magnetic measurement values, the magnetic measurement values acquired during one sequence are acquired in a same measurement period.

On the other hand, the second magnetic gradient according to the present invention is a difference between the first magnetic gradients with the targeting magnetic measurement values acquired in different measurement periods. The different measurement periods of acquiring the targeting magnetic measurement values refer to, for example, when a measurement process is repeatedly performed, measurement periods which belong to different laps during the repeated process. Since the position of a travelling vehicle in the travelling direction advances with the lapse of time, the second magnetic gradient can be grasped as a difference between the first magnetic gradients at two positions in the travelling direction.

The filter processing according to the present invention may be processing by an analog filter or digital filter. As a digital filter, an infinite impulse response (IIR) filter such as a Kalman filter or a finite impulse response (FIR) filter can be adopted. As an analog filter, a CR filter with a combination of a capacitor and a resistor, an LC filter with a combination of a coil and a capacitor, or the like can be adopted.

In the magnetic marker detection method of one suitable embodiment in the present invention, the plurality of magnetic sensors are arrayed at least in a vehicle width direction of the vehicle and, in the gradient generating process, at least as the first magnetic gradient, a magnetic gradient representing a difference between magnetic measurement values of two magnetic sensors arrayed in the vehicle width direction is generated.

With a sensor array having a plurality of magnetic sensors along the vehicle width direction adopted and attached to the vehicle, magnetism of the magnetic marker can be reliably measured in a manner of, for example, tracing with a line scanner.

In the magnetic marker detection method of one suitable embodiment in the present invention, the plurality of magnetic sensors are arrayed at least in the travelling direction and, in the gradient generating process, at least as the first magnetic gradient, a magnetic gradient representing a difference between magnetic measurement values of two magnetic sensors arrayed in the travelling direction is generated.

With the plurality of magnetic sensors arrayed in the travelling direction, for example, a difference between magnetic measurement values of two magnetic sensors simultaneously performing measurements is computed, thereby allowing a magnetic gradient in the travelling direction to be calculated with high accuracy.

In the magnetic marker detection method of one suitable embodiment in the present invention, frequency characteristics of a filter applied to the filter processing are switched depending on whether the road which the vehicle is travelling is a road for exclusive use of automobiles or any of other ordinary roads.

When the road for exclusive use of automobiles is compared with any of other ordinary roads, these roads are different in the size of a structure such as a bridge or tunnel and the presence or absence of a sign of a shop on the road. Thus, by switching the frequency characteristics of the filter depending on the road, reliability of detection of the magnetic marker can be further improved.

EMBODIMENTS

Embodiments of the present invention are specifically described by using the following embodiments.

First Embodiment

A first embodiment is an example regarding a magnetic marker detection method for detecting magnetic markers 10 laid on a road, and a magnetic marker detection device 1 which performs this magnetic marker detection method. Details of the present embodiment are described by using FIG. 1 to FIG. 8.

The magnetic marker detection method is a method for detecting the magnetic markers 10 laid on a road while a vehicle 5 having a plurality of magnetic sensors C1 to C15 (represented as Cn as appropriate, and n is a natural number from 1 to 15) attached thereto is travelling, as depicted in FIG. 1 to FIG. 3.

This magnetic marker detection method includes a gradient generation process of generating a first magnetic gradient, which is a difference between magnetic measurement values of two magnetic sensors among the magnetic sensors C1 to C15 arrayed in a vehicle width direction, and a filter processing process of generating a filter output value by performing filter processing by a high-pass filter which cuts off a low frequency component as to a change of the first magnetic gradient in a travelling direction of the vehicle 5.

In the following, details of the method are described.

The magnetic marker detection system 1S is configured with a combination of magnetic markers 10 laid on a road and a magnetic marker detection device 1 in the vehicle 5, as depicted in FIG. 1 and FIG. 2.

The magnetic markers 10 are laid on a road surface 100S along the center of a lane 100 where the vehicle 5 travels. The magnetic markers 10 each have a flat shape with a diameter of 100 mm and a thickness of 1.5 mm, and can be adhesively jointed onto the road surface 100S.

The magnetic marker detection device 1 is a device with a combination of a sensor array 11 having fifteen magnetic sensors Cn arrayed on one straight line and a detection unit 12 having a CPU not depicted and so forth incorporated therein.

The sensor array 11 is a sensor unit to be attached to a vehicle's body floor 50, which corresponds to a bottom surface of the vehicle 5. In the vehicle 5 of the present embodiment, the attachment height with reference to the road surface 100S is set at 200 mm.

The detection unit 12 is an arithmetic operation unit which performs various arithmetic operation processes for detecting the magnetic markers 10. The detection unit 12 performs the arithmetic operation processes by using sensor signals outputted from the sensor array 11. The detection results from the detection unit 12 are inputted to, for example, an ECU, not depicted, in the vehicle 5, or the like, for use in various types of control such as automatic steering control and lane departure warning for keeping the lane. In place of the present embodiment, the function of the detection unit 12 may be incorporated into the sensor array 11 for integration.

In the following, the structures of the sensor array 11 and the detection unit 12 are described, and then the operation of the magnetic marker detection device 1 is described.

The sensor array 11 of FIG. 3 includes, in addition to the fifteen magnetic sensors Cn, difference circuits G1 to G14 (represented as Gm as appropriate, and m is a natural number from 1 to 14) which each perform difference operation for magnetic measurement values from two adjacent magnetic sensors. This sensor array 11 is attached along the vehicle width direction so that the magnetic sensor C1 is positioned on the left side of the vehicle (passenger's seat side of a right-hand-drive vehicle).

A space between the magnetic sensors Cn in the sensor array 11 is required to be set so as to allow detection of magnetism of one magnetic marker 10 by at least two magnetic sensors Cn. This space setting allows calculation of magnetic gradients by the above-described difference circuits Gm. Thus, in the present embodiment, the space between the magnetic sensors Cn in the sensor array 11 is set at 70 mm.

The sensor array 11 outputs magnetic gradients in the vehicle width direction, which are difference operation values from the difference circuits Gm, as sensor signals. The sensor array 11 includes output ports of fourteen channels not depicted so as to simultaneously output the difference operation values from the difference circuits Gm.

Here, the structure of each magnetic sensor Cn is described. In the present embodiment, as depicted in FIG. 4, a one-chip MI sensor is adopted as the magnetic sensor Cn, with a MI element 21 and a drive circuit integrated together. The MI element 21 includes an amorphous wire 211 with approximately zero magnetostriction and made of a CoFeSiB-based alloy, and a pickup coil 213 wound around this amorphous wire 211. The magnetic sensor Cn measures a voltage occurring at the pickup coil 213 when a pulse current is applied to the amorphous wire 211, thereby detecting magnetism acting on the amorphous wire. The MI element 21 has detection sensitivity in an axial direction of the amorphous wire 211 as the magneto-sensitive body. In each magnetic sensor Cn of the sensor array 11 of the present embodiment, the amorphous wire 211 is disposed along the vehicle width direction.

The drive circuit is an electronic circuit including a pulse circuit 23 which supplies a pulse current to the amorphous wire 211 and a signal processing circuit 25 which samples and outputs a voltage occurring at the pickup coil 213 at a predetermined timing. The pulse circuit 23 includes a pulse generator 231 which generates a pulse signal serving as a source of a pulse current. The signal processing circuit 25 extracts an induced voltage of the pickup coil 213 via a synchronous detector 251 which is opened and closed in conjunction with the pulse signal and amplifies the voltage at a predetermined amplification factor by an amplifier 253. A signal acquired by amplification by this signal processing circuit 25 is outputted to the outside as a sensor signal.

The magnetic sensor Cn is a highly-sensitive sensor having a measurement range of the magnetic flux density of ±0.6 mT (milli tesla) and a magnetic flux resolution in that measurement range of 0.02 µT. This high sensitivity is achieved by the MI element 21 using the MI effect, in which the impedance of the amorphous wire 211 sensitively changes in accordance with the external magnetic field. Furthermore, this magnetic sensor Cn can perform high-speed sampling with a period of 3 kHz, and also supports vehicle's high-speed traveling. In the present embodiment, the period of magnetic measurement by the sensor array 11 is set at 3 kHz. The sensor array 11 inputs a sensor signal to the detection unit 12 every time a magnetic measurement is performed.

The detection unit 12 of FIG. 3 is a unit including an electronic board (omitted in the drawings) having mounted thereon a CPU (central processing unit) for performing various arithmetic operations, memory elements such as a ROM (read only memory) and a RAM (random access memory), and so forth. The detection unit 12 and the difference circuits Gm of the sensor array 11 form a detection unit which performs the magnetic marker detection method of the present embodiment. This detection unit 12 supports collective capturing of sensor signals of fourteen channels outputted from the sensor array 11.

The detection unit 12 includes a filter processing circuit 125 (FIG. 3) which perform filter processing for sequential data outputted from the sensor array 11 as sensor signals and a detection processing circuit 127 which performs a marker detection process. This detection unit 12 is provided with data areas M1 to M14 (represented as Mm as appropriate) for storing data (magnetic gradients in the vehicle width direction) outputted from the sensor array 11 and data areas H1 to H14 (represented as Hm as appropriate) for storing filter output values in filter processing.

The data areas Mm are storage areas for sequentially storing data represented by the sensor signals of fourteen channels outputted from the sensor array 11 with the period of 3 kHz as described above as sequential data for each channel.

The filter processing circuit 125 is a circuit which performs filter processing, for each channel, on the sequential data of fourteen channel stored in the data areas Mm. A filter to be applied to this filter processing is a high-pass filter which suppresses or cuts off a low frequency component and lets a high frequency component pass through. In the present embodiment, an IIR filter is used as a filter.

Next, the magnetic marker detection method to be performed by the above-configured magnetic marker detection device 1 is described along a flow diagram of FIG. 5. The process in FIG. 5 is performed in synchronization with a measurement by each magnetic sensor Cn of the sensor array 11.

The sensor array 11 performs magnetic measurement by each magnetic sensor Cn with the period of 3 kHz (S101). As described above, in each magnetic sensor Cn, the amorphous wire 211 (refer to FIG. 4) as a magneto-sensitive body is disposed along the vehicle width direction. Since the magnetism from the magnetic marker 10 acting in the vehicle width direction goes toward the outside of the magnetic marker 10, the magnetic direction in the vehicle width direction acting on each magnetic sensor Cn is reversed between the left side and the right side of the magnetic marker 10.

Each graph in FIG. 6 illustrates a magnetic distribution in the vehicle width direction acting on each of the magnetic sensors Cn configuring the sensor array 11. In FIG. 6, a travelling direction (time direction) of the vehicle 5 is defined from a position p1 at the upper left to a position p7 at the lower right, and a moment when the sensor array 11 is positioned straight above the magnetic marker 10 is represented as a position p4. The sensor array 11 approaches the magnetic marker 10 in a section from the position p1 to the position p4, and goes away from the magnetic marker 10 from the position p4 to the position p7.

In a magnetic distribution waveform in the vehicle width direction at each position in FIG. 6, although there is a difference in amplitude of the waveform, a zero-cross occurs at each position in accordance with the position of the magnetic marker 10 in the vehicle width direction, with two alternate mountainous portions with an opposite sign on both sides of the zero-cross. When the vehicle 5 having the sensor array 11 attached thereto passes the magnetic marker 10, the amplitude of the two-mountain distribution waveform gradually increases as the vehicle 5 approaches the magnetic marker 10, and becomes a maximum amplitude when the vehicle 5 comes straight above the magnetic marker 10 (position p4). Then, as the vehicle 5 goes away from the magnetic marker 10, the amplitude of the two-mountain distribution waveform gradually decreases.

The magnetic measurement values of the respective magnetic sensor Cn are inputted to the difference circuits Gm (FIG. 3) configuring the sensor array 11. For example, magnetic measurement values of the magnetic sensors C1 and C2 are inputted to the difference circuit G1, and difference operation of subtracting the magnetic measurement value of the magnetic sensor C1 from the magnetic measurement value of the magnetic sensor C2 is performed (S102, gradient generating process). In this manner, the difference circuit Gm performs difference operation of subtracting the magnetic measurement value of the magnetic sensor Cm (m is a natural number from 1 to 14) from the magnetic measurement value of the magnetic sensor C(m+1).

The difference operation value of the difference circuit Gm is a difference between magnetic measurement values of two adjacent magnetic sensors Cn in the sensor array 11, and represents a magnetic gradient in the vehicle width direction, which is an example of the first magnetic gradient. The distribution waveform of the magnetic gradient in the vehicle width direction has a shape with a high mountainous portion interposed between small adjacent mountainous portions with a pole opposite to that of the high mountainous portion, as depicted in respective graphs at the positions p1 to p7 in FIG. 7.

The difference operation (gradient generating process) at S102 of FIG. 5 is effective in removing common magnetic noise uniformly acting on the respective magnetic sensors Cn. The common magnetic noise may occur not only from geomagnetism but also from a large-sized magnetism generation source such as iron bridges and another vehicle with high possibility. In the case of a large magnetism generation source, the magnetic field loop from the N pole to the S pole is significantly increased, and thus the magnetic field becomes almost uniform at an intermediate position between both poles, causing the magnetism acting on each magnetic sensor Cn to become almost uniform.

The sensor array 11 outputs, in a collective manner, sensor signals of fourteen channels formed of the difference operation values from the difference circuits Gm. The detection unit 12 stores sequential data for each channel based on these sensor signals in the data areas Mm (FIG. 3). When acquiring a new sensor signal, the detection unit 12 deletes the oldest data in the data areas Mm and sequentially forwards each piece of data in the data areas Mm to provide a free area, and then stores data represented by the newly-acquired sensor signal in that free area.

The sequential data in the data area Mm is distributed in a one-mountain shape, in which the amplitude increases as the vehicle 5 approaches the magnetic marker 10, becomes maximum at the position p4, and then decreases as the vehicle 5 goes away from the magnetic marker 10. For example, a diagonal graph at the right in FIG. 7 represents changes in sequential data corresponding to positions in the vehicle width direction where the vehicle 5 passes straight above the magnetic markers 10. In this graph, the axis diagonally downward to the right is defined as the travelling direction (time direction), and an axis orthogonal thereto is defined as the magnetic gradient in the vehicle width direction.

The detection unit 12 inputs each piece of sequential data stored in the data areas Mm to the filter processing circuit 125 for each channel to perform filter processing of cutting off a low frequency component and letting a high frequency component pass through (S103 in FIG. 5, filter processing process). Specifically, filter output values are computed by convolution operation by the IIR filter on the sequential data in the data areas Mm, and are stored in the data areas Hm (FIG. 3).

The detection unit 12 performs a marker detection process for detecting the magnetic marker 10 by using the filter output values stored in the data areas Hm (S104). The detection unit 12 detects the presence or absence of the magnetic marker 10 and, when detecting the presence of the magnetic marker 10, finds, by arithmetic operation, a position of the magnetic marker 10 in the vehicle width direction facing the sensor array 11.

For example, the difference operation at S102 of FIG. 5 has some effect in, for example, a large magnetism generation source such as a bridge or tunnel. However, even in such a large magnetism generation source, a loop-shaped magnetic field is formed at the periphery of an end serving as a magnetic pole, and thereby causes a magnetic gradient. If a magnetic gradient is generated, removal only with the difference operation at S102 is difficult.

Between a large magnetism generation source and a small magnetism generation source, a change ratio of the magnetic gradient differs depending on the distance between the magnetic poles. That is, in a large magnetism generation source with a long distance between the magnetic poles, a distance until a magnetic gradient of one magnetic pole makes a transition to a magnetic gradient of the other magnetic pole is long, and the change of the magnetic gradient is mild. On the other hand, in a small magnetism generation source with a short distance between the magnetic poles, the change of the magnetic gradient is abrupt, and the change ratio is large. According to the filter processing of cutting off a low frequency component, a magnetic gradient with mild changes and a small change ratio can be removed.

When the vehicle passes one magnetic marker, the magnetic gradient in the vehicle width direction acquired by the difference operation at S102 of FIG. 5 changes as indicated by a diagonal graph on the right in FIG. 7. For example, when the vehicle 5 travels along a lane, ideally, a peak occurs every time the vehicle 5 passes the magnetic marker 10. However, in actual road environments, magnetism generation sources such as bridges and tunnels are present, and thus an ideal change is not acquired in which a peak periodically appears every time the vehicle passes the magnetic marker 10 and the possibility of receiving influences of disturbance magnetism as depicted in FIG. 8A is high. For this change of the magnetic gradient in the vehicle width direction, if a low frequency component is cut off, the change can be made closer to the ideal change as depicted in FIG. 8B in which the above-described peak periodically appears, allowing easy detection of the magnetic marker 10. For example, if threshold processing is performed for the change depicted in FIG. 8B, periodically-appearing peaks can be detected, and thus the magnetic marker 10 can be detected.

In the above-configured magnetic marker detection method, magnetism as disturbance is removed with a combination of the gradient generating process of taking a difference between magnetic measurement values of two magnetic sensors and the filter processing process of performing filter processing by a high-pass filter as to a change of the magnetic gradient in the travelling direction. While uniformly-acting disturbance magnetism can be effectively removed by the difference between magnetic measurement values of two magnetic sensors, disturbance magnetism from a peripheral magnetic field at ends as magnetic poles of a large magnetism generation source such as a bridge or tunnel can be effectively removed by the filter processing by the high-pass filter.

In this manner, the magnetic marker detection method of the present embodiment has an excellent feature in that the magnetic marker 10 can be reliably detected by removing magnetism as disturbance. The magnetic marker detection device 1 which performs this magnetic marker detection method has an excellent characteristic of being able to reliably detect the magnetic marker 10.

While the magnetic sensors Cn with sensitivity in the vehicle width direction are adopted in the present embodiment, magnetic sensors with sensitivity in the travelling direction may be adopted, or magnetic sensors with sensitivity in a vertical direction may be adopted. Furthermore, for example, magnetic sensors with sensitivity in two axial directions including the vehicle width direction and the travelling direction or two axial direction s including the travelling direction and the vertical direction may be adopted. For example, magnetic sensors with sensitivity in three axial directions including the vehicle width direction, the travelling direction, and the vertical direction may be adopted. With the use of magnetic sensors with sensitivity in a plurality of axial directions, the magnitude of magnetism and the acting direction of magnetism can be measured, and magnetic vectors can be generated. With the use of a difference between magnetic vectors and a change ratio of that difference in the travelling direction, magnetism of the magnetic markers 10 and disturbance magnetism may be differentiated from each other.

In the present embodiment, exemplarily described are the sensor array 11 which performs a magnetic measurement with the period of 3 kHz and the detection unit 12 which captures a sensor signal every time this sensor array 11 performs a magnetic measurement. In place of the sensor array 11 which performs a magnetic measurement periodically at regular intervals, for example, a sensor array 11 which performs a magnetic measurement every time the vehicle moves over a predetermined distance, for example, 20 mm. With the use of a sensor signal from a speed sensor or the like which senses the rotation of the wheel, the travelling distance of the vehicle can be grasped. Alternatively, a configuration may be adopted in which while the sensor array 11 performs a magnetic measurement at a sufficiently quick period, the period of capturing a sensor signal in the detection unit 12 is different from the measurement period. For example, the detection unit 12 may be configured so as to capture a sensor signal from the sensor array 11 every time the vehicle moves at a predetermined distance.

While one-dimensional filter processing regarding the travelling direction (time direction) of the vehicle is exemplarily described, spatial filter processing may be performed to remove disturbance magnetism as to magnetic changes in a two-dimensional space defined by the travelling direction (time direction) of the vehicle and the vehicle width direction. A spatial filter may be applied also to magnetic changes in a two-dimensional space defined by the vehicle width direction and the vertical direction. Furthermore, as to magnetic changes in a time-spatial region having this two-dimensional space combined with the traveling direction (time direction) of the vehicle, a time-spatial filter may be applied to remove disturbance magnetism.

The road for exclusive use of automobiles such as a highway and any of other ordinary roads have differences in, for example, the widths of lanes and the presence or absence of a sign of a shop, a power pole, and so forth. Thus, depending on whether the road is a road for exclusive use of automobiles or of any of other ordinary roads, frequency characteristics of a filter applied to the filter processing may be switched. For example, for a road for exclusive use of automobiles with a relatively wide lane and a small number of shop signs and so forth, the cutoff frequency of cutting of low frequency may be decreased and the cutoff characteristics of the filter may be set to be mild. With mild cutoff characteristics, design flexibility of the filter is enhanced, and the operation load required for filter processing can be reduced. On the other hand, for an ordinary road with a relative large number of magnetism generation sources as disturbance, the cutoff frequency may be switched to be higher. Furthermore, the spacing between markers laid on the road in the travelling direction may be sensed, and the frequency characteristics of the filter may be switched in accordance with this spacing. Still further, in place of the high-pass filter, a band-pass filter which lets a frequency component in a specific frequency region pass through can be adopted.

In the present example, the magnetic gradients in the vehicle width direction is generated by difference operation for the magnetic sensors Cn arrayed in the vehicle width direction. In place of or in addition to this, the magnetic sensors Cn may be arrayed in the traveling direction of the vehicle, and a magnetic gradient in the travelling direction may be found by difference operation for two magnetic sensors arrayed in the travelling direction and be taken as a first magnetic gradient.

Second Embodiment

In a second embodiment, a pretreatment for the filter processing is added to the magnetic marker detection method of the first embodiment. Details are described with reference to FIG. 9 to FIG. 12.

The detection unit 12 of FIG. 9 is basically the detection unit 12 of the first embodiment, with difference circuits T1 to T14 (represented as Tm as appropriate) and data areas N1 to N14 (represented as Nm as appropriate) for storing difference operation values from the difference circuits Tm added between the data areas Mm and the filter processing circuit 125.

The difference circuits Tm are circuits which take a magnetic gradient in the vehicle width direction represented by the sensor signal from the sensor array 11 as a first magnetic gradient and a difference between first magnetic gradients at two positions separated away with a predetermined distance in the travelling direction of the vehicle as a magnetic gradient in the travelling direction, which is an example of a second magnetic gradient.

The data areas Nm are storage areas for storing the second magnetic gradients, which are difference operation values from the differential circuits Tm, every time the second magnetic gradients are generated, as appropriate time as sequential data in the travelling direction. The filter processing is targeted on the sequential data in the data areas Nm.

Next, details of the magnetic marker detection method of the present embodiment is described along a flow diagram of FIG. 10. Of processes in FIG. 10, step S101 of performing magnetic measurements by each magnetic sensor Cn of the sensor array 11 and step S102 of computing a magnetic gradient in the vehicle width direction (a gradient generating process) are identical in specifications to those in the first embodiment. The sensor array 11 generates magnetic gradients in the vehicle width direction, which are first magnetic gradients, by difference operation at step S102, and then outputs sensor signals of fourteen channels in a collective manner.

Upon acquiring the sensor signals from the sensor array 11, the detection unit 12 sequentially stores the magnetic gradients in the vehicle width direction represented by the sensor signals in the data areas Mn to generate sequential data. As described with reference to FIG. 7, changes of the magnetic gradients in the vehicle width direction represented by the sequential data are as in a graph of FIG. 11A in the travelling direction of the vehicle.

The detection unit 12 takes the magnetic gradients in the vehicle width direction as first magnetic gradients, and computes a difference between the first magnetic gradients at two positions in the travelling direction, thereby generating a magnetic gradient in the travelling direction as a second magnetic gradient (S112, a gradient generating process). Specifically, pieces of data (magnetic gradient in the vehicle width direction) at two positions separated away from each other with a predetermined distance in the travelling direction are selected from the sequential data of the magnetic gradients in the vehicle width direction changing as depicted in a graph of FIG. 11A, and a difference between the selected pieces of data is computed, thereby generating a magnetic gradient in the travelling direction as a second magnetic gradient. The detection unit 12 sequentially generates a magnetic gradient in the travelling direction as a second magnetic gradient, as shifting the "predetermined distance" in FIG. 11A to the travelling direction. Then, thus generated magnetic gradients in the travelling direction are stored in the data areas Nm, and thereby sequential data of the second magnetic gradients in the travelling direction is generated. A distribution of the magnetic gradients in the travelling direction formed of this sequential data is as indicated by a graph exemplarily depicted in FIG. 11B.

The detection unit 12 inputs sequential data of the magnetic gradients of fourteen channels in the travelling direction stored in the data areas Nm to the filter processing circuit 125, which performs filter processing of cutting off a low frequency component and letting a high frequency component pass through (S103). Then, the detection processing circuit 127 of the detection unit 12 performs marker detection processing for detecting the magnetic marker 10 by using the data stored in the data areas Hm (S104).

For example, the magnetic gradient in the travelling direction while the vehicle 5 is travelling along a lane ideally changes so that a waveform including a zero-cross of FIG. 11B repeats every time the vehicle passes the magnetic marker 10. However, for example, when the vehicle comes near a structure as a magnetism generation source such as abridge or tunnel, the magnetic field on the periphery of magnetic poles positioned at ends of the structure as a magnetism generation source such as a bridge may act to cause a change of the magnetic gradient in the travelling direction as depicted in FIG. 12A. For this change, the filter processing at the above-described step S103 is quite effective. If the filter processing of cutting off a low frequency component is applied as to the change of FIG. 12A, the change can be made closer to the ideal change as depicted in FIG. 12B in which the above-described zero-cross periodically appears.

The above-described predetermined distance for generating a magnetic gradient in the travelling direction as a second magnetic gradient is preferably set at, for example, 30 mm to 150 mm, in view of the size of the magnetic marker as a detection target. Furthermore, for example, if a function of estimating the size of the magnetic marker 10 is provided to the magnetic marker detection device 1 and peripherals and the above-described predetermined distance is changed in accordance with the estimated size, magnetic marker of various specifications can be reliably detected.

In the present embodiment, a difference between magnetic measurement values of adjacent sensors in the vehicle width direction is taken as a first magnetic gradient, a difference between first magnetic gradients at two positions in the travelling direction is taken as a second magnetic gradient, and filter processing is applied to a change of the second magnetic gradient in the travelling direction. Here, the filter processing is applied to the change of the magnetic gradient after second-order difference operation is performed. Alternatively, the number of order of difference operation can be increased to third, fourth, . . . . While the increase of the number of order of difference operation is particularly effective in removing magnetic noise uniformly acting the respective magnetic sensors, the increase of the number of order of difference operation tends to decrease the level of an effective signal to degrade the S/N ratio. For selection of the number of order of difference operation, it is preferable to consider the balance between the effect of the removing magnetic noise and the adverse influence of the decrease of the S/N ratio.

The other structures, operations, and effects are similar to those of the first embodiment.

Third Embodiment

In a third embodiment, the structure of the sensor array 11 of the magnetic marker detection device of the first embodiment is changed. Details are described with reference to FIG. 13.

In the sensor array 11 of the present embodiment, magnetic sensors are arrayed in a two-dimensional array with two rows in the travelling direction and fifteen columns in the vehicle width direction. In this sensor array 11, a space between magnetic sensors in the vehicle width direction is 70 mm as with the first embodiment, and a space between magnetic sensors in the travelling direction is 30 mm.

In each of the magnetic sensors configuring the sensor array 11, an amorphous wire as a magneto-sensitive body is disposed along the travelling direction of the vehicle, and magnetic sensitivity is set in the travelling direction. In the following description, fifteen magnetic sensors at the front in the travelling direction are represented as C1A to C15A (hereinafter represented as CnA, and n is a natural number from 1 to 15), and fifteen magnetic sensors at the back in the travelling direction are represented as C1B to C15B (hereinafter represented as CnB, and n is a natural number from 1 to 15).

The sensor array 11 of the present embodiment is provided with difference circuits of two types, that is, difference circuits K1 to K15 (hereinafter represented as Kn) and difference circuits S1 to S14 (hereinafter represented as Sm, and m is a natural number from 1 to 14). The difference circuit Kn computes a difference between the magnetic measurement value of the magnetic sensor CnA and the magnetic measurement value of the magnetic sensor CnB to find a first magnetic gradient. The difference circuit Sm computes a difference between the first magnetic gradient from the difference circuit Km+1 and the first magnetic gradient from the difference circuit Km to find a new first magnetic gradient different from the first magnetic gradient from the difference circuit Kn.

The sensor array 11 outputs first magnetic gradients, which are difference operation values from the difference circuits Kn, in a collective manner via output ports of fourteen channels not depicted. As with the first embodiment, the detection unit 12 includes the data areas M1 to M14. The detection unit 12 stores, in the data areas M1 to M14, the first magnetic gradients of fourteen channels outputted in a collective manner from the sensor array 11 every time the first magnetic gradients are outputted, and generates sequential data for each channel.

To this sequential data for each channel, as with the first embodiment, the detection unit 12 applies filter processing by a high-pass filter, and stores filter output values, which are outputs of the filter processing, in the data areas H1 to H14. The detection unit 12 then performs a marker detection process with the filter output values stored in the data areas H1 to H14 taken as input values to detect the presence or absence of a magnetic marker, for example.

To calculate a difference between the magnetic measurement values of two magnetic sensors (a first magnetic gradient by the above-described difference circuit Kn), two magnetic sensors arranged at a narrow spacing on the order of 10 mm to 50 mm are preferably taken as targets. However, if the magnetic sensors are arrayed in the vehicle width direction at narrow spacings of, for example, 30 mm, to achieve the sensor array 11 with a width of 1 m, approximately thirty-three magnetic sensors (1 m/30 mm) are required for each row in the vehicle width direction. If this array of the magnetic sensors is provided on two rows in the travelling direction, approximately sixty-six magnetic sensors are required, which is a double, in the entire sensor array 11. On the other hand, if the space between the magnetic sensors in the travelling direction is set 30 mm and the space therebetween in the vehicle width direction is set at 70 mm as in the present embodiment, the number of magnetic sensors required for the sensor array 11 can be reduced, and the sensor array 11 can be configured of approximately twenty-eight magnetic sensors, which is a double of (1 m/70 mm)=approximately 14.

The other structures, operations, and effects are similar to those of the first embodiment.

While the specific examples of the present invention have been described above in detail as in the above embodiments, these specific examples merely describe examples of technologies included in the claims. Needless to say, the claims should not be restrictively construed by the structures, numerical values, and so forth of the specific examples. The claims include technologies obtained by variously modifying, changing, and combining the specific examples as appropriate by using known technologies, knowledge, and so forth by people skilled in the art.

DESCRIPTION OF SYMBOLS 1 magnetic marker detection device
1S magnetic marker detection system
10 magnetic marker
100 lane
11 sensor array
12 detection unit
125 filter processing circuit
127 detection processing circuit
5 vehicle

What is claimed is:

1. A magnetic marker detection method for detecting a magnetic marker laid on a road by using at least two or more magnetic sensors attached to a vehicle, the magnetic marker detection method including:
generating a first magnetic gradient that is calculated by first-order difference operation, second-order difference operation, or higher-order difference operation targeted on magnetic measurement values acquired in a same measurement period by the at least two or more magnetic sensors such that magnetic noise uniformly acting on the at least two or more magnetic sensors are removed; and then
generating a filtered output value by suppressing or cutting off at least a low frequency component among changes in the first magnetic gradient in a travelling direction of the vehicle such that a disturbance magnetism changing in the travelling direction and derived from ends of a magnetism generation source larger in size than the magnetic marker is removed, wherein
at least part of input data of processing for detecting the magnetic marker is the filtered output value.

2. The magnetic marker detection method according to claim 1, wherein
the two or more magnetic sensors are arrayed at least in a vehicle width direction of the vehicle and at least as the first magnetic gradient, a magnetic gradient representing a difference between magnetic measurement values of two magnetic sensors arrayed in the vehicle width direction is generated.

3. The magnetic marker detection method according to claim 2, wherein
the two or more magnetic sensors are arrayed at least in the travelling direction and at least as the first magnetic gradient, a magnetic gradient representing a difference between magnetic measurement values of two magnetic sensors arrayed in the travelling direction is generated.

4. The magnetic marker detection method according to claim 3, wherein
frequency characteristics of a filter applied to the filter processing are switched depending on whether the road which the vehicle is travelling is a road for exclusive use of automobiles or any of other ordinary roads such that a cutoff frequency of a filter for the road for exclusive use of automobiles is lower than a cutoff frequency of a filter for the any of other ordinary roads.

5. A magnetic marker detection device mounted on a vehicle for detecting a magnetic marker laid on a road, the magnetic marker detection device comprising:
at least two or more magnetic sensors; and
detection circuitry which detects the magnetic marker,
the detection circuitry being configured to perform the magnetic marker detection method according to claim 4.

6. A magnetic marker detection device mounted on a vehicle for detecting a magnetic marker laid on a road, the magnetic marker detection device comprising:
at least two or more magnetic sensors; and
detection circuitry which detects the magnetic marker,
the detection circuitry being configured to perform the magnetic marker detection method according to claim 3.

7. The magnetic marker detection method according to claim 2, wherein
frequency characteristics of a filter applied to the filter processing are switched depending on whether the road which the vehicle is travelling is a road for exclusive use of automobiles or any of other ordinary roads such that a cutoff frequency of a filter for the road for exclusive use of automobiles is lower than a cutoff frequency of a filter for the any of other ordinary roads.

8. A magnetic marker detection device mounted on a vehicle for detecting a magnetic marker laid on a road, the magnetic marker detection device comprising:
at least two or more magnetic sensors; and
detection circuitry which detects the magnetic marker,
the detection circuitry being configured to perform the magnetic marker detection method according to claim 7.

9. A magnetic marker detection device mounted on a vehicle for detecting a magnetic marker laid on a road, the magnetic marker detection device comprising:
at least two or more magnetic sensors; and
detection circuitry which detects the magnetic marker,
the detection circuitry being configured to perform the magnetic marker detection method according to claim 2.

10. The magnetic marker detection method according to claim 1, wherein
the two or more magnetic sensors are arrayed at least in the travelling direction and at least as the first magnetic gradient, a magnetic gradient representing a difference between magnetic measurement values of two magnetic sensors arrayed in the travelling direction is generated.

11. The magnetic marker detection method according to claim 10, wherein
frequency characteristics of a filter applied to the filter processing are switched depending on whether the road which the vehicle is travelling is a road for exclusive use of automobiles or any of other ordinary roads such that a cutoff frequency of a filter for the road for exclusive use of automobiles is lower than a cutoff frequency of a filter for the any of other ordinary roads.

12. A magnetic marker detection device mounted on a vehicle for detecting a magnetic marker laid on a road, the magnetic marker detection device comprising:
at least two or more magnetic sensors; and
detection circuitry which detects the magnetic marker,
the detection circuitry being configured to perform the magnetic marker detection method according to claim 11.

13. A magnetic marker detection device mounted on a vehicle for detecting a magnetic marker laid on a road, the magnetic marker detection device comprising:
at least two or more magnetic sensors; and
detection circuitry which detects the magnetic marker, the detection circuitry being configured to perform the magnetic marker detection method according to claim 10.

14. The magnetic marker detection method according to claim 1, wherein
frequency characteristics of a filter applied to the filter processing are switched depending on whether the road which the vehicle is travelling is a road for exclusive use of automobiles or any of other ordinary roads such that a cutoff frequency of a filter for the road for exclusive use of automobiles is lower than a cutoff frequency of a filter for the any of other ordinary roads.

15. A magnetic marker detection device mounted on a vehicle for detecting a magnetic marker laid on a road, the magnetic marker detection device comprising:
at least two or more magnetic sensors; and
detection circuitry which detects the magnetic marker,
the detection circuitry being configured to perform the magnetic marker detection method according to claim 14.

16. A magnetic marker detection device mounted on a vehicle for detecting a magnetic marker laid on a road, the magnetic marker detection device comprising:
at least two or more magnetic sensors; and
detection circuitry which detects the magnetic marker,
the detection circuitry being configured to perform the magnetic marker detection method according to claim 1.

17. A magnetic marker detection method for detecting a magnetic marker laid on a road by using at least two or more magnetic sensors attached to a vehicle, the magnetic marker detection method including:
generating a first magnetic gradient that is calculated by first-order difference operation, second-order difference operation, or higher-order difference operation targeted on magnetic measurement values acquired in a same measurement period by the at least two or more magnetic sensors such that magnetic noise uniformly acting on the at least two or more magnetic sensors are removed; then
generating a second magnetic gradient that is a difference between first magnetic gradients with the targeted magnetic measurement values acquired in different measurement periods; and then
generating a filtered output value by suppressing or cutting off at least a low frequency component among changes in the second magnetic gradient in a travelling direction of the vehicle such that a disturbance magnetism changing in the travelling direction and
derived from ends of a magnetism generation source larger in size than the magnetic marker is removed, wherein
at least part of input data of processing for detecting the magnetic marker is the filtered output value.

* * * * *